United States Patent
Nishioka et al.

(10) Patent No.: US 12,199,408 B2
(45) Date of Patent: Jan. 14, 2025

(54) LIGHT EMITTING APPARATUS AND PROJECTOR

(71) Applicants: SEIKO EPSON CORPORATION, Tokyo (JP); SOPHIA SCHOOL CORPORATION, Tokyo (JP)

(72) Inventors: Hiroki Nishioka, Nagano Ken Suwa Shi (JP); Katsumi Kishino, Tokyo To Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 649 days.

(21) Appl. No.: 17/494,815

(22) Filed: Oct. 5, 2021

(65) Prior Publication Data

US 2022/0109286 A1  Apr. 7, 2022

(30) Foreign Application Priority Data

Oct. 6, 2020 (JP) .................. 2020-169006

(51) Int. Cl.
*H01S 5/343* (2006.01)
*H01S 5/11* (2021.01)
(Continued)

(52) U.S. Cl.
CPC .............. *H01S 5/11* (2021.01); *H01S 5/3063* (2013.01); *H01S 5/3425* (2013.01);
(Continued)

(58) Field of Classification Search
CPC ...... H01S 5/314; H01S 5/185; H01S 5/34333; H01S 5/2077; H01L 33/06; H01L 33/08; H01L 33/18; H01L 33/24; H01L 33/46
See application file for complete search history.

(56) References Cited

U.S. PATENT DOCUMENTS

| 2007/0075318 A1 | 4/2007 | Noda et al. |
| 2009/0175304 A1 | 7/2009 | Noda et al. |

(Continued)

FOREIGN PATENT DOCUMENTS

| JP | 2004296538 | 10/2004 |
| JP | 2007273730 | 10/2007 |

(Continued)

*Primary Examiner* — Tod T Van Roy
*Assistant Examiner* — Delma R Forde
(74) *Attorney, Agent, or Firm* — JCIPRNET

(57) ABSTRACT

A light emitting apparatus includes a laminated structure including a plurality of columnar section assemblies each formed of p columnar sections. The p columnar sections each include a light emitting layer. When viewed in the lamination direction of the laminated structure, the ratio of the maximum width to the minimum width of the light emitting layer in each of q first columnar sections out of the p columnar sections is greater than the ratio of the light emitting layer in each of r second columnar sections out of the p columnar sections. The light emitting layer in each of the p columnar sections does not have a rotationally symmetrical shape. The parameter p is an integer greater than or equal to 2. The parameter q is an integer greater than or equal to 1 but smaller than p. The parameter r is an integer that satisfies $r=p-q$.

4 Claims, 9 Drawing Sheets

(51) Int. Cl.
   *H01S 5/30*    (2006.01)
   *H01S 5/34*    (2006.01)
   G03B 21/20     (2006.01)
   *H01S 5/125*   (2006.01)

(52) U.S. Cl.
   CPC ...... *H01S 5/34333* (2013.01); *G03B 21/2033* (2013.01); *H01S 5/125* (2013.01)

(56) References Cited

U.S. PATENT DOCUMENTS

| | | |
|---|---|---|
| 2012/0161187 A1 | 6/2012 | Wierer, Jr. et al. |
| 2016/0261093 A1 | 9/2016 | Noda et al. |
| 2020/0044418 A1 | 2/2020 | Nishioka et al. |
| 2020/0313039 A1* | 10/2020 | Ishizawa ................ H01L 33/08 |
| 2022/0115843 A1* | 4/2022 | Noda ................ H01S 5/320225 |

FOREIGN PATENT DOCUMENTS

| | | |
|---|---|---|
| JP | 2008098379 | 4/2008 |
| JP | 2013009002 | 1/2013 |
| JP | 2019029522 | 2/2019 |
| JP | 2020024978 | 2/2020 |
| WO | 2014136607 | 9/2014 |

* cited by examiner

LIGHT EMITTING APPARATUS AND PROJECTOR

The present application is based on, and claims priority from JP Application Serial Number 2020-169006, filed Oct. 6, 2020, the disclosure of which is hereby incorporated by reference herein in its entirety.

BACKGROUND

1. Technical Field

The present disclosure relates to a light emitting apparatus and a projector.

2. Related Art

Semiconductor lasers are expected as a high-luminance, next-generation light source. Among the semiconductor lasers, semiconductor lasers using nanocolumns are expected to achieve high power light emission at small radiation angles based on the photonic crystal effect provided by the nanocolumns. Such a semiconductor laser is used, for example, as the light source of a projector. In a projector using a liquid crystal light valve, the light outputted from the light source is desired to be linearly polarized.

Semiconductor lasers using photonic crystals that form GaN-based nanocolumns can be designed in accordance with the wavelengths of the three primary colors, R, G, and B, by changing the nanocolumn arrangement cycle and the diameter of the nanocolumns. However, to achieve laser oscillation in the red region, it is necessary to use nanocolumns having a large diameter, which make it difficult to achieve the nanocolumn effects of reduction in the number of defects and distortions and an increase in light emission efficiency. To overcome the problem described above, there is a known technology that allows nanocolumn assemblies each formed of a plurality of nanocolumns having a small diameter to be regarded as nanocolumns and periodically arranged.

The light emitted from the light emitting apparatus is not linearly polarized because the nanocolumns are arranged in a lattice pattern having rotational symmetry, such as a triangular, square, or hexagonal pattern, as described in JP-A-2013-9002.

Even when nanocolumn assemblies are each formed of a plurality of nanocolumns as described above, the nanocolumn assemblies arranged in a lattice pattern having rotational symmetry does not allow the light emitting apparatus to emit linearly polarized light.

SUMMARY

A light emitting apparatus according to an aspect of the present disclosure includes a laminated structure including a plurality of columnar section assemblies each formed of p columnar sections. The p columnar sections each include a light emitting layer. When viewed in a lamination direction of the laminated structure, a ratio of a maximum width to a minimum width of the light emitting layer in each of q first columnar sections out of the p columnar sections is greater than the ratio of the light emitting layer in each of r second columnar sections out of the p columnar sections. The light emitting layer in each of the p columnar sections does not have a rotationally symmetrical shape. The parameter p is an integer greater than or equal to 2. The parameter q is an integer greater than or equal to 1 but smaller than p. The parameter r is an integer that satisfies $r=p-q$.

A projector according to another aspect of the present disclosure includes the light emitting apparatus according to the aspect of the present disclosure.

DESCRIPTION OF EXEMPLARY EMBODIMENTS

A preferable embodiment of the present disclosure will be described below in detail with reference to the drawings. It is not intended that the embodiment described below unduly limits the contents of the present disclosure set forth in the appended claims. Further, all configurations described below are not necessarily essential configuration requirements of the present disclosure.

1. Light Emitting Apparatus

Figure 1:
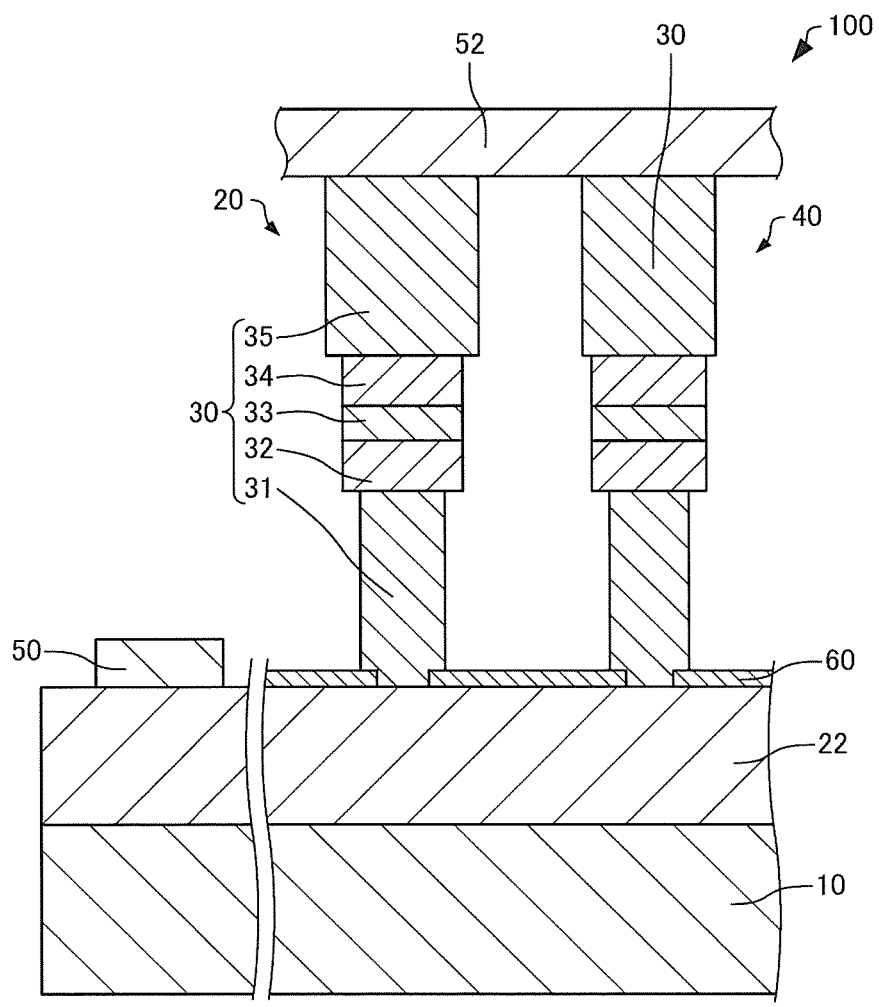
FIG. 1 is a cross-sectional view diagrammatically showing a light emitting apparatus according to an embodiment of the present disclosure.

A light emitting apparatus according to the present embodiment will first be described with reference to the drawings. FIG. 1 is a cross-sectional view diagrammatically showing a light emitting apparatus 100 according to the present embodiment. FIG. is a plan view diagrammatically showing the light emitting apparatus 100 according to the present embodiment. FIG. 1 is a cross-sectional view taken along the line I-I in FIG. 2.

Figure 2:
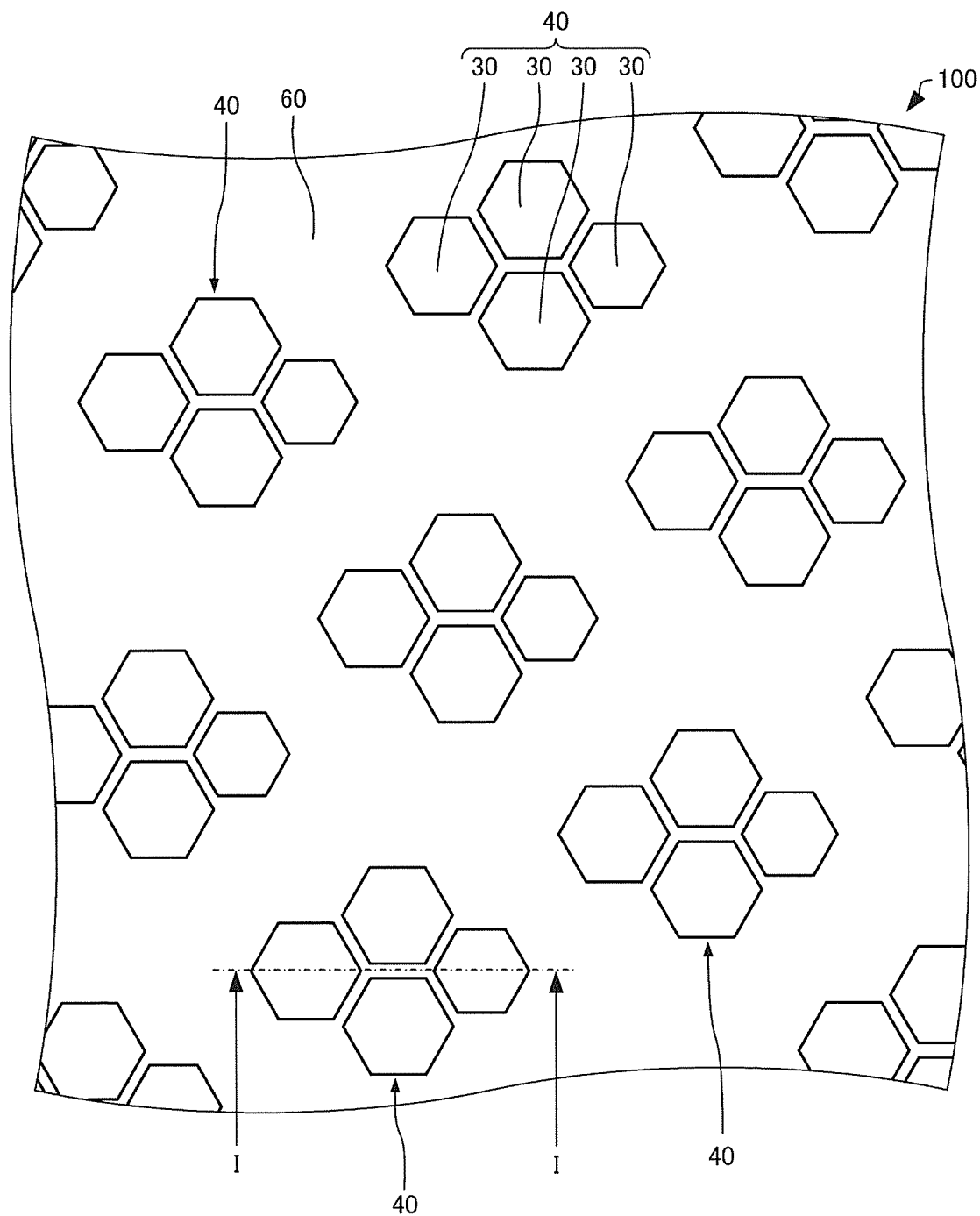
FIG. 2 is a plan view diagrammatically showing the light emitting apparatus according to the present embodiment.

The light emitting apparatus 100 includes a substrate 10, a laminated structure 20, a first electrode 50, and a second electrode 52, as shown in FIGS. 1 and 2. The second electrode 52 is omitted in FIG. 2 for convenience.

The substrate 10 is, for example, an Si substrate, a GaN substrate, or a sapphire substrate.

The laminated structure 20 is provided at the substrate 10. In the illustrated example, the laminated structure 20 is provided on the substrate 10. The laminated structure 20 includes, for example, a buffer layer 22 and columnar sections 30.

The present specification will be described on the assumption that in a lamination direction of the laminated structure 20 (hereinafter also simply referred to as "lamination direction"), the direction from a light emitting layer 33 as a reference toward a second semiconductor layer 35 is called "upper", and the direction from the light emitting layer 33 as the reference toward a first semiconductor layer 31 is called "lower". The direction perpendicular to the lamination direction is also called an "in-plane direction".

In the present disclosure, the "lamination direction of the laminated structure 20" refers to the direction in which the first semiconductor layer 31 and the light emitting layer 33 of each of the columnar sections 30 are laminated structured on each other.

The buffer layer 22 is provided on the substrate 10. The buffer layer 22 is, for example, an n-type GaN layer into which Si has been doped. A mask layer 60 for forming the columnar sections 30 is provided on the buffer layer 22. The mask layer 60 is, for example, a silicon oxide layer, a titanium layer, a titanium oxide layer, or an aluminum oxide layer.

The columnar sections 30 are provided on the buffer layer 22. The columnar sections 30 each have a columnar shape protruding upward from the buffer layer 22. The columnar sections 30 are each also called, for example, a nano-column, a nano-wire, a nano-rod, and a nano-pillar. The columnar sections 30 each have, for example, a regular hexagonal planar shape or any other polygonal planar shape or a circular planar shape. In the example shown in FIG. 2, the columnar sections 30 each have a regular hexagonal planar shape.

The columnar sections 30 each have a diameter, for example, greater than or equal to 50 nm but smaller than or equal to 500 nm. When the diameter of the columnar sections 30 is smaller than or equal to 500 nm, a high-quality-crystal light emitting layer 33 can be produced, and distortion intrinsically present in the light emitting layer 33 can be reduced. The light produced in the light emitting layer 33 can thus be efficiently amplified.

In a case where the columnar sections 30 each have a circular planar shape, "the diameter of the columnar sections" is the diameter of the circular shape, and when the columnar sections 30 each have a non-circular planar shape, the diameter of the columnar sections is the diameter of the smallest enclosing circle enclosing the non-circular shape. For example, when the columnar sections 30 each have a polygonal planar shape, the diameter of the columnar sections 30 is the diameter of the smallest circle enclosing the polygonal shape, and when the columnar sections 30 each have an elliptical planar shape, the diameter of the columnar sections 30 is the diameter of the smallest circle enclosing the elliptical shape. In the case where the columnar sections 30 each have a circular planar shape, "the centers of the columnar sections" are each the center of the circle, and when the columnar sections 30 each have a non-circular planar shape, the centers of the columnar sections are each the center of the smallest enclosing circle enclosing the non-circular shape. The "center of a columnar section assembly" is the center of the smallest circle enclosing the columnar section 30 that forms a columnar section assembly 40, that is, the smallest enclosing circle in the plan view along the lamination direction.

The columnar sections 30 each include, for example, the first semiconductor layer 31, a first guide layer 32, the light emitting layer 33, a second guide layer 34, and the second semiconductor layer 35, as shown in FIG. 1.

The first semiconductor layers 31 are provided on the buffer layer 22. The first semiconductor layer 31 is provided between the substrate 10 and the light emitting layer 33. The first semiconductor layer 31 is, for example, an n-type GaN layer to which Si has been doped.

The first guide layer 32 is provided on the first semiconductor layer 31. The first guide layer 32 has a diameter greater than the diameter of the first semiconductor layer 31. The first guide layer 32, for example, has a semiconductor superlattice (SL) structure formed of i-type GaN layers and i-type InGaN layers. The numbers of GaN layers and of InGaN layers that form the first guide layer 32 are each not limited to a specific number.

The light emitting layer 33 is provided on the first guide layer 32. The light emitting layer 33 is provided between the first semiconductor layers 31 and the second semiconductor layer 35. The light emitting layer 33, for example, has a diameter greater than that of the first semiconductor layer 31. The light emitting layer 33 produces light when a current is injected thereinto. The light emitting layer 33, for example, has a quantum well (MQW) structure formed of i-type GaN layers and i-type InGaN layers. The numbers of GaN layers and InGaN layers that form the light emitting layer 33 are each not limited to a specific number.

The second guide layer 34 is provided on the light emitting layer 33. The second guide layer 34, for example, has a semiconductor superlattice (SL) structure formed of i-type GaN layers and i-type InGaN layers. The numbers of GaN layers and InGaN layers that form the second guide layer 34 are each not limited to a specific number. The first guide layer 32 and the second guide layer 34 are layers that increase the amount of overlap between the light emitting layer 33 and the light propagating in the in-plane direction. A light confinement coefficient can thus be increased.

The second semiconductor layer 35 is provided on the second guide layer 34. The second semiconductor layer 35, for example, has a diameter greater than that of the light emitting layer 33. The second semiconductor layer 35 differs from the first semiconductor layers 31 in terms of conductivity type. The second semiconductor layer 35 is, for example, a p-type GaN layer to which Mg has been doped. The first semiconductor layers 31 and the second semiconductor layer 35 are each a cladding layer having the function of confining the light in the light emitting layer 33.

In the light emitting apparatus 100, the p-type second semiconductor layers 35, the i-type light emitting layers 33 and guide layers 32 and 34, into which no impurity has been doped, and the n-type first semiconductor layers 31 form pin diodes. In the light emitting apparatus 100, when a forward bias voltage for the pin diodes is applied to the space between the first electrode 50 and the second electrode 52, a current is injected into the light emitting layers 33, whereby electrons and holes recombine with each other in the light emitting layers 33. The recombination causes light emission. The photonic crystal effect provided by the plurality of columnar sections 30 causes the light produced in the light emitting layers 33 and propagated in the in-plane direction to form a standing wave, which receives gain in the light emitting layers 33 to achieve laser oscillation. The light emitting apparatus 100 then outputs positive first order diffracted light and negative first order diffracted light as laser light in the lamination direction.

Although not shown, a reflection layer may be provided between the substrate 10 and the buffer layer 22 or below the substrate 10. The reflection layer is, for example, a distributed Bragg reflector (DBR) layer. The reflection layer can reflect the light generated in the light emitting layers 33, and the light emitting apparatus 100 can emit light only via the side facing the second electrode 52.

Figure 3:
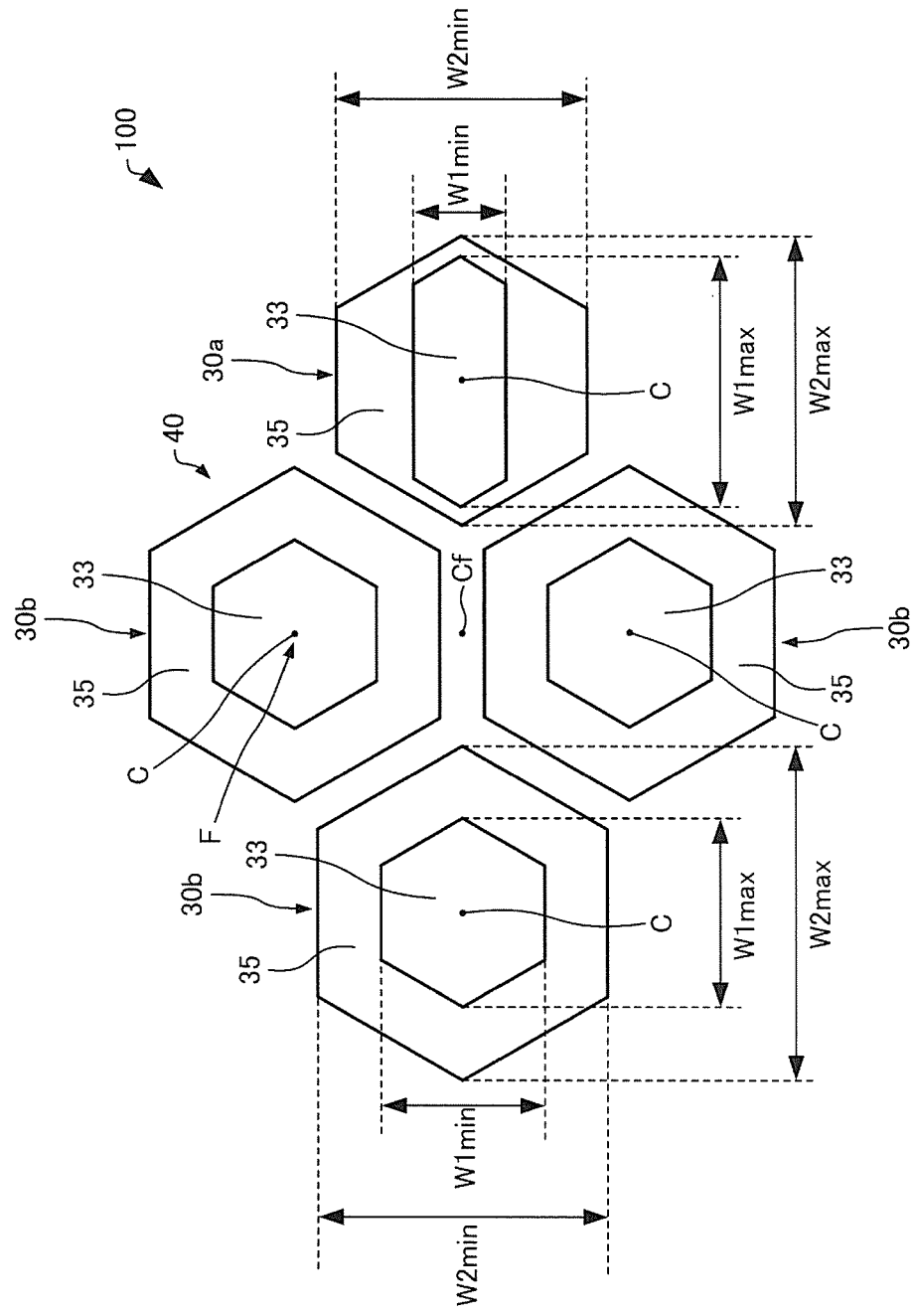
FIG. 3 is a plan view diagrammatically showing the light emitting apparatus according to the present embodiment.

The columnar sections 30 form the columnar section assemblies 40. The laminated structure 20 includes a plurality of columnar section assemblies 40, as shown in FIG. 2. In the illustrated example, the plurality of columnar section assemblies 40 are arranged in a triangular lattice. The distance between the centers of adjacent columnar section assemblies 40 is, for example, greater than or equal to 50 nm but smaller than or equal to 350 nm when viewed in the lamination direction. FIG. 3 is a plan view diagrammatically showing the columnar section assemblies 40 and illustrates the light emitting layers 33 and the second semiconductor layers 35.

The columnar section assemblies 40 are each formed of p columnar sections 30, as shown in FIGS. 2 and 3. Parameter "p" is an integer greater than or equal to 2, for example, an integer greater than or equal to 3 but smaller than or equal to 15, preferably an integer greater than or equal to 3 but smaller than or equal to 7. In the illustrated example, "p" is 4, and the columnar section assemblies 40 are each formed of 4 columnar sections 30. The columnar section assemblies 40 are each an assembly of columnar sections 30 that allow light oscillation in the red region. In each of the columnar section assemblies 40, the distance between the centers of adjacent columnar sections 30 is, for example, greater than or equal to 50 nm but smaller than or equal to 150 nm when viewed in the lamination direction.

In the columnar section assembly 40, for example, the figure F formed of the centers C of the p columnar sections 30 is rotationally symmetric when viewed in the lamination direction, as shown in FIG. 3. That is, the figure F is n-fold symmetric, where n is an integer greater than or equal to 2. In the illustrated example, the figure F is four-fold symmetric. Since the figure F formed of three or more centers C, for example, is rotationally symmetric as described above, light that resonates in a plurality of directions is confined in the in-plane direction more isotropically than when the figure F is not rotationally symmetric, for example, when three or more columnar sections are arranged along a straight line. Columnar section assemblies 40 that allow light oscillation in the red region are therefore readily formed. In the illustrated example, the centers C of the columnar sections 30 are located at the vertices of a parallelogram that is not shown. In the present embodiment, the situation in which the figure F is rotationally symmetric means that the figure F is rotationally symmetric around a center Cf of the figure F. The center Cf of the figure F is the center of the smallest enclosing circle enclosing the figure F.

In each of the columnar section assemblies 40, when viewed in the lamination direction, the ratio of the maximum width to the minimum width of the light emitting layer 33 in each of q first columnar sections 30a out of the p columnar sections 30 (hereinafter also referred to as "width ratio") is greater than the width ratio of the light emitting layer 33 in each of r second columnar sections 30b out of the p columnar sections 30. Parameter "q" is an integer greater than or equal to 1 but smaller than or equal to p and is 1 in the illustrated example. Parameter "r" is an integer that satisfies r=p−q and is 3 in the illustrated example.

The maximum width of each of the light emitting layers 33 is the maximum width of the portion passing through the center of the light emitting layer 33. The minimum width of each of the light emitting layers 33 is the minimum width of the portion passing through the center of the light emitting layer 33. In the example shown in FIG. 3, the light emitting layers 33 each have a maximum width W1max and a minimum width W1min, and the direction of the maximum width W1max and the direction of the minimum width W1min are perpendicular to each other. The maximum width W1max of the light emitting layer 33 in each of the first columnar sections 30a is greater than the maximum width W1max of the light emitting layer 33 in each of the second columnar sections 30b. The minimum width W1min of the light emitting layer 33 in each of the first columnar sections 30a is smaller than the minimum width W1min of the light emitting layer 33 in each of the second columnar sections 30b.

In each of the columnar section assemblies 40, since the width ratio of the light emitting layer 33 in each of the first columnar sections 30a is greater than the width ratio of the light emitting layer 33 in each of the second columnar sections 30b, the light emitting layers 33 of the p columnar sections 30 that form the columnar section assembly 40 each do not have a rotational symmetric shape when viewed in the lamination direction. That is, when m is an integer greater than or equal to 2, the light emitting layers 33 of the columnar section assemblies 40 each do not have an m-fold symmetric shape.

In each of the columnar section assemblies 40, when viewed in the lamination direction, the area of the light emitting layer 33 in each of the first columnar sections 30a is equal, for example, to the area of the light emitting layer 33 in each of the second columnar sections 30b. In the illustrated example, the area of the second semiconductor layer 35 in each of the first columnar sections 30a is smaller than the area of the second semiconductor layer 35 in each of the second columnar sections 30b. Although not shown, the columnar sections 30 may each have a core-shell structure in which the light emitting layer 33 and the second semiconductor layer 35 are disposed also on the side facing the side surface of the first semiconductor layer 31. In this case, the total area of the upper surface and side surface of the light emitting layer 33 in each of the first columnar sections 30a may be equal to the total area of the upper surface and side surface of the light emitting layer 33 in each of the second columnar sections 30b.

In each of the columnar section assemblies 40, the width ratio of the light emitting layer 33 in each of the first columnar sections 30a is greater than the width ratio of the second semiconductor layer 35 in each of the first columnar sections 30a and the width ratio of the second semiconductor layer 35 in each of the second columnar sections 30b. In the illustrated example, the width ratio of the light emitting layer 33 in each of the second columnar sections 30b is equal to the width ratio of the second semiconductor layer 35 in each of the second columnar sections 30b. The maximum width of each of the second semiconductor layers 35 is the maximum width of the portion passing through the center of the second semiconductor layer 35. The minimum width of each of the second semiconductor layers 35 is the minimum width of the portion passing through the center of the second semiconductor layer 35. In the example shown in FIG. 3, the second semiconductor layers 35 each have a maximum width W2max and a minimum width W2min, and the direction of the maximum width W2max and the direction of the minimum width W2min are perpendicular to each other.

In each of the columnar section assemblies 40, when viewed in the lamination direction, the difference in the width ratio between the second semiconductor layer 35 in each of the first columnar sections 30a and the second semiconductor layer 35 in each of the second columnar sections 30b is, for example, smaller than the difference in the width ratio between the light emitting layer 33 in each of the first columnar sections 30a and the light emitting layer 33 in each of the second columnar sections 30b. When viewed in the lamination direction, the difference in the width ratio between the light emitting layer 33 in each of the first columnar sections 30a and the second semiconductor layer 35 in each of the first columnar sections 30a is greater than the difference in the width ratio between the light emitting layer 33 in each of the second columnar sections 30b and the second semiconductor layer 35 in each of the second columnar sections 30b.

In each of the columnar section assemblies 40, the carrier concentration in the second semiconductor layer 35 in each of the first columnar sections 30a is, for example, higher than the carrier concentration in the second semiconductor layer 35 in each of the second columnar sections 30b. The carrier concentration in each of the second semiconductor layers 35 can be estimated, for example, by using an atom probe analysis method to measure the impurity concentration.

The first electrode 50 is provided on the buffer layer 22. The buffer layer 22 may be in ohmic contact with the first electrode 50. The first electrode 50 is electrically coupled to the first semiconductor layers 31. In the illustrated example, the first electrode 50 is electrically coupled to the first semiconductor layers 31 via the buffer layer 22. The first electrode 50 is one of the electrodes for injecting the current into the light emitting layers 33. The first electrode 50 is, for example, a laminated structure of a Cr layer, an Ni layer, and an Au layer laminated structured in the presented order from the side facing the buffer layer 22.

The second electrode 52 is provided on the second semiconductor layers 35. The second electrode 52 is electrically coupled to the second semiconductor layers 35. The second semiconductor layers 35 may be in ohmic contact with the second electrode 52. The second electrode 52 is the other one of the electrodes for injecting the current into the light emitting layers 33. The second electrode 52 is made, for example, of an indium tin oxide (ITO).

The above description has been made of the InGaN-based light emitting layers 33, and the light emitting layers 33 can be made, in accordance with the wavelength of the light to be outputted therefrom, of any of a variety of other materials capable of emitting light when a current is injected thereinto. Examples of the material of the light emitting layers 33 may include an AlGaN-based, AlGaAs-based, InGaAs-based, InGaAsP-based, InP-based, GaP-based, and AlGaP-based semiconductor materials.

The light emitting apparatus 100 can provide, for example, the following effects and advantages.

The light emitting apparatus 100 includes the laminated structure 20 including a plurality of columnar section assemblies 40 each formed of p columnar sections 30, and the p columnar sections 30 each have the light emitting layer 33. When viewed in the lamination direction, the width ratio of the light emitting layer 33 in each of the q first columnar sections 30a out of the p columnar sections 30 is greater than the width ratio of the light emitting layer 33 in each of the r second columnar sections 30b out of the p columnar sections 30, and the light emitting layer 33 in each of the p columnar sections 30 does not have a rotationally symmetric shape. The light emitted from the light emitting apparatus 100 is therefore linearly polarized. The light emitting apparatus 100 is therefore preferably used, for example, as the light source of a projector using a liquid crystal light valve. Further, the light emitting apparatus 100 can emit, for example, light having a single peak.

Figure 4:
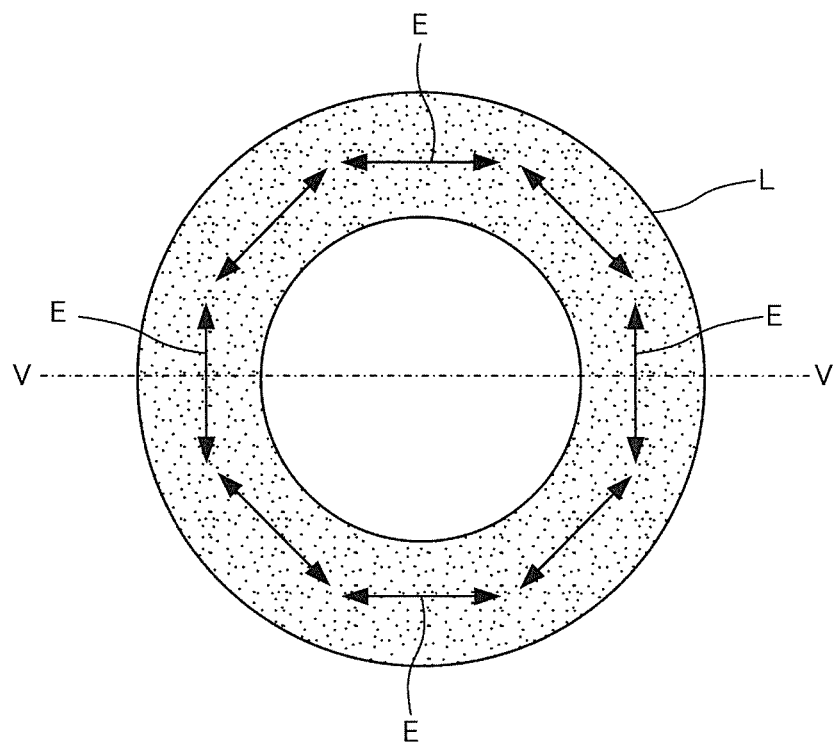
FIG. 4 is a diagram for explaining the polarized light produced when the light emitting layer in each of the p columnar sections that form any of the columnar section assemblies has a rotationally symmetric shape.
Figure 5:
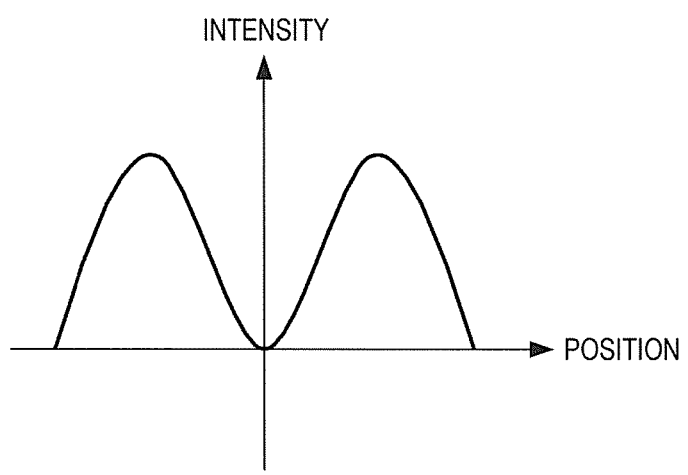
FIG. 5 is a graph for describing the optical intensity according to the present embodiment.
Figure 6:
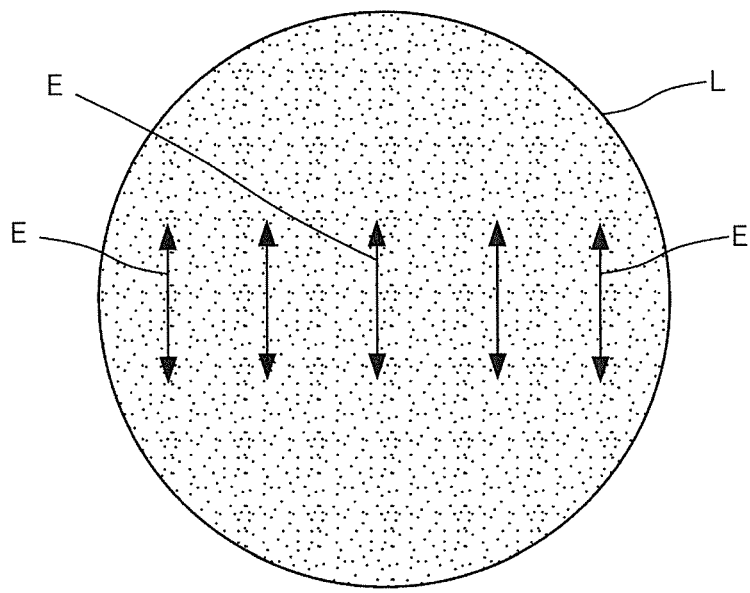
FIG. 6 is a diagram for explaining the polarized light from the light emitting apparatus according to the present embodiment.

FIG. 4 describes the polarized light produced when the light emitting layer in each of the p columnar sections that form any of the columnar section assemblies has a rotationally symmetric shape. FIG. 5 shows a graph for describing the optical intensity along the line V-V shown in FIG. 4. FIG. 6 describes the polarized light from the light emitting apparatus 100. When the light emitting layer in each of the p columnar sections has a rotationally symmetric shape, the vibration directions of electric fields E of the emitted light L in a variety of positions therein are not aligned with one another, for example, as shown in FIG. 4, and the electric fields E cancel with one another out in a central portion of the light L, as shown in FIGS. 4 and 5. The emitted light L or beam therefore has a donut shape. On the other hand, in the light emitting apparatus 100, the light emitting layer 33 in each of the p columnar sections 30 does not have a rotationally symmetrical shape, so that the vibration directions of the electric fields E are all aligned with one another, as shown in FIG. 6, and the light emitted from the light emitting apparatus 100 is therefore linearly polarized. In the example shown in FIG. 6, the emitted light L has a circular shape. That is, the emitted light L has a single peak.

In the light emitting apparatus 100, when viewed in the lamination direction, the area of the light emitting layer 33 in each of the first columnar sections 30a is equal to the area of the light emitting layer 33 in each of the second columnar section 30b. Therefore, in the light emitting apparatus 100, the light emission characteristics of the light emitting layer 33 in each of the first columnar sections 30a can be made closer to the light emission characteristics of the light emitting layer 33 in each of the second columnar sections 30b than when the area of the light emitting layer in each of the first columnar sections differs from the area of the light emitting layer in each of the second columnar sections.

In the light emitting apparatus 100, the p columnar sections 30 each include the n-type first semiconductor layer 31 and the p-type second semiconductor layer 35, and the light emitting layer 33 is provided between the first semiconductor layer 31 and the second semiconductor layer 35. When viewed in the lamination direction, the difference in the width ratio between the second semiconductor layer 35 in each of the first columnar sections 30a and the second semiconductor layer 35 in each of the second columnar sections 30b (hereinafter also referred to as "first difference") is smaller than the difference in the width ratio between the light emitting layer 33 in each of the first columnar sections 30a and the light emitting layer 33 in each of the second columnar sections 30b (hereinafter also referred to as "second difference"). Therefore, in the light emitting apparatus 100, the planar shape of the second semiconductor layer 35 in each of the first columnar sections 30a can be made closer to the planar shape of the second semiconductor layer 35 in each of the second columnar sections 30b, and the specific surface area of the second semiconductor layer 35 in each of the first columnar sections 30a can be made closer to the specific surface area of the second semiconductor layer 35 in each of the second columnar sections 30b than in a case where the first difference is greater than the second difference. The difference in current-voltage (I-V) characteristics between the first columnar sections 30a and the second columnar sections 30b can thus be reduced. A depletion region where no current flows is present in the vicinity of the surface of each of the second semiconductor layers 35. The difference in the I-V characteristics between the first columnar sections 30a and the second columnar sections 30b can therefore be reduced by making the specific surface area of the second semiconductor layer 35 in each of the first columnar sections 30a closer to the specific surface area of the second semiconductor layer 35 in each of the second columnar sections 30b. In particular, since the p-type second semiconductor layers 35 have higher resistance than the n-type first semiconductor layers 31, the I-V characteristics are readily affected by controlling the second semiconductor layers 35 than controlling the first semiconductor layers 31.

For example, when the amount of carriers injected into the columnar sections varies in accordance with the I-V characteristics thereof, the columnar sections into which a small amount of carriers has been injected will experience a relative decrease in gain and, in extreme cases, absorb the light, resulting in optical loss. In the columnar sections into which a large amount of carriers have been injected, the excessive carrier injection causes a decrease in differential gain and quantum efficiency. Different I-V characteristics of the columnar sections reduce the light emission efficiency, as described above. The light emitting apparatus 100 can avoid the problems described above and achieve a highly efficient laser that outputs linearly polarized light.

In the light emitting apparatus 100, the carrier concentration in the second semiconductor layer 35 in each of the first columnar sections 30a is higher than the carrier concentration in the second semiconductor layer 35 in each of the second columnar sections 30b. Therefore, in the light emitting apparatus 100 in which, for example, the width ratio of the light emitting layer 33 in each of the first columnar sections 30a is greater than the width ratio of the light emitting layer 33 in each of the second columnar sections 30b, the resistance of the second semiconductor layer 35 in each of the first columnar sections 30a can be made closer to the resistance of the second semiconductor layer 35 in each of the second columnar sections 30b even when the area of the second semiconductor layer 35 in each of the first columnar sections 30a is smaller than the area of the second semiconductor layer 35 in each of the second columnar sections 30b.

2. Method for Manufacturing Light Emitting Apparatus

Figure 7:
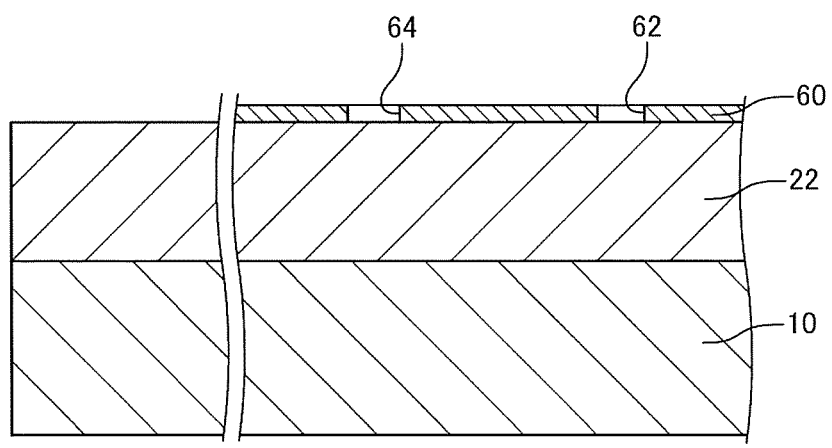
FIG. 7 is a cross-sectional view diagrammatically showing one of the steps of manufacturing the light emitting apparatus according to the present embodiment.

A method for manufacturing the light emitting apparatus 100 according to the present embodiment will next be described with reference to the drawings. FIG. 7 is a cross-sectional view diagrammatically showing one of the steps of manufacturing the light emitting apparatus 100 according to the present embodiment.

The buffer layer 22 is epitaxially grown on the substrate 10, as shown in FIG. 7. Examples of the epitaxial growth method may include a metal organic chemical vapor deposition (MOCVD) method and a molecular beam epitaxy (MBE) method.

The mask layer 60 is then formed on the buffer layer 22. The mask layer 60 is formed, for example, by film deposition using an electron beam evaporation method or a plasma chemical vapor deposition (CVD) method and patterning using photolithography and etching.

The mask layer 60 is so patterned that the width ratio of openings 62 for forming the first columnar sections 30a is greater than the width ratio of openings 64 for forming the second columnar sections 30b when viewed in the lamination direction. The width ratio of the light emitting layer 33 in each of the first columnar sections 30a can thus be greater than the width ratio of the light emitting layer 33 in each of the second columnar sections 30b.

The mask layer 60 is further so patterned, for example, that the area of the light emitting layer 33 in each of the first columnar sections 30a is equal to the area of the light emitting layer 33 in each of the second columnar sections 30b when viewed in the lamination direction.

The mask layer 60 is used as a mask to epitaxially grow the first semiconductor layers 31, the first guide layers 32, the light emitting layers 33, the second guide layers 34, and the second semiconductor layer 35 in the presented order on the buffer layer 22, as shown in FIG. 1. Examples of the epitaxial growth method may include the MOCVD method and the MBE method.

The epitaxial growth of the second semiconductor layers 35 is performed under the conditions that the second semiconductor layers 35 each grow, for example, isotropically in the lateral direction (in-plane direction) from the center of the light emitting layer 33 when viewed in the lamination direction. The difference in the width ratio between the second semiconductor layer 35 in each of the first columnar sections 30a and the second semiconductor layer 35 in each of the second columnar sections 30b can thus be smaller than the difference in the width ratio between the light emitting layer 33 in each of the first columnar sections 30a and the light emitting layer 33 in each of the second columnar sections 30b. Examples of the conditions include the film deposition temperature, the film deposition rate, the composition, and the positions of the columnar sections 30.

Furthermore, the epitaxial growth of the second semiconductor layers 35 is so performed, for example, that the carrier concentration in the second semiconductor layer 35 in each of the first columnar sections 30a is higher than the carrier concentration in the second semiconductor layer 35 in each of the second columnar sections 30b. For example, when the semiconductor layers each have a c surface and a facet, the amount of dopant introduced via the c surface is greater than that introduced via the facet. Therefore, for example, the first columnar sections 30a and the second columnar sections 30b are grown under growth conditions that the proportion of the c surface in each of the first columnar sections 30a is greater than the proportion of the c surface in each of the second columnar sections 30b. The carrier concentration in the second semiconductor layer 35 in each of the first columnar sections 30a can thus be higher than the carrier concentration in the second semiconductor layer 35 in each of the second columnar sections 30b.

The columnar section assemblies 40 each formed of a plurality of columnar sections 30 can be formed by carrying out the steps described above.

Thereafter, the first electrode 50 is formed on the buffer layer 22, and the second electrode 52 is formed on the second semiconductor layers 35. The first electrode 50 and the second electrode 52 are formed, for example, by a vacuum evaporation method. The first electrode 50 and the second electrode 52 are not necessarily formed in a specific order.

The light emitting apparatus 100 can be manufactured by carrying out the steps described above.

3. Variation of Manufacturing Method

A variation of the method for manufacturing the light emitting apparatus 100 according to the present embodiment will next be described with reference to the drawings. FIGS. 8 to 11 are cross-sectional views diagrammatically showing the steps of manufacturing the light emitting apparatus 100 according to the present embodiment.

In "2. Method for manufacturing light emitting apparatus" described above, changing the ratio between the c surface and the facet has been described as an example of making the carrier concentration in the second semiconductor layer 35 in each of the first columnar sections 30a higher than the carrier concentration in the second semiconductor layer 35 in each of the second columnar sections 30b.

In contrast, an example in which the carrier concentration in the second semiconductor layer 35 in each of the first columnar sections 30a is made higher than the carrier concentration in the second semiconductor layer 35 in each of the second columnar sections 30b by forming the columnar sections 30 in two steps will be described in the following sections. In the following description, the same portions as those in the manufacturing method described in "2. Method for manufacturing the light emitting apparatus" will not be described or will be described in a simplified manner.

Figure 8:
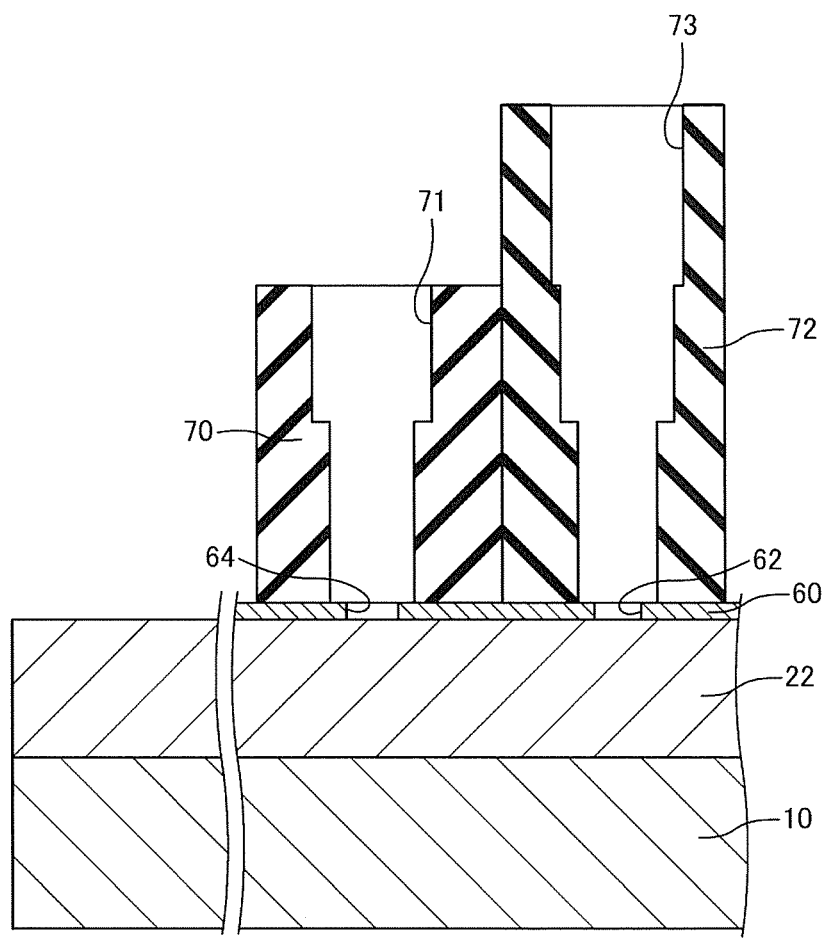
FIG. 8 is a cross-sectional view diagrammatically showing one of the steps of manufacturing the light emitting apparatus according to the present embodiment.

After forming the mask layer 60 in the same manner as in "2. Method for manufacturing the light emitting apparatus" described above, first SAG layers 70 and second SAG layers 72 are formed, as shown in FIG. 8. SAG means selective region growth and is also called selective area growth. The SAG layers 70 and 72 are formed, for example, by using a CVD (chemical vapor deposition) method or a sputtering method. The SAG layers 70 and 72 are each, for example, a silicon oxide layer, a silicon nitride layer, a titanium oxide layer, or an aluminum oxide layer. The second SAG layers 72 are thicker than the first SAG layers 70.

Thereafter, the first SAG layers 70 are so patterned that openings 71 are formed, and the second SAG layers 72 are so patterned that openings 73 are formed. The patterning is performed, for example, by photolithography and etching. The openings 71 communicate with the openings 64. The openings 73 communicate with the openings 62.

Figure 9:
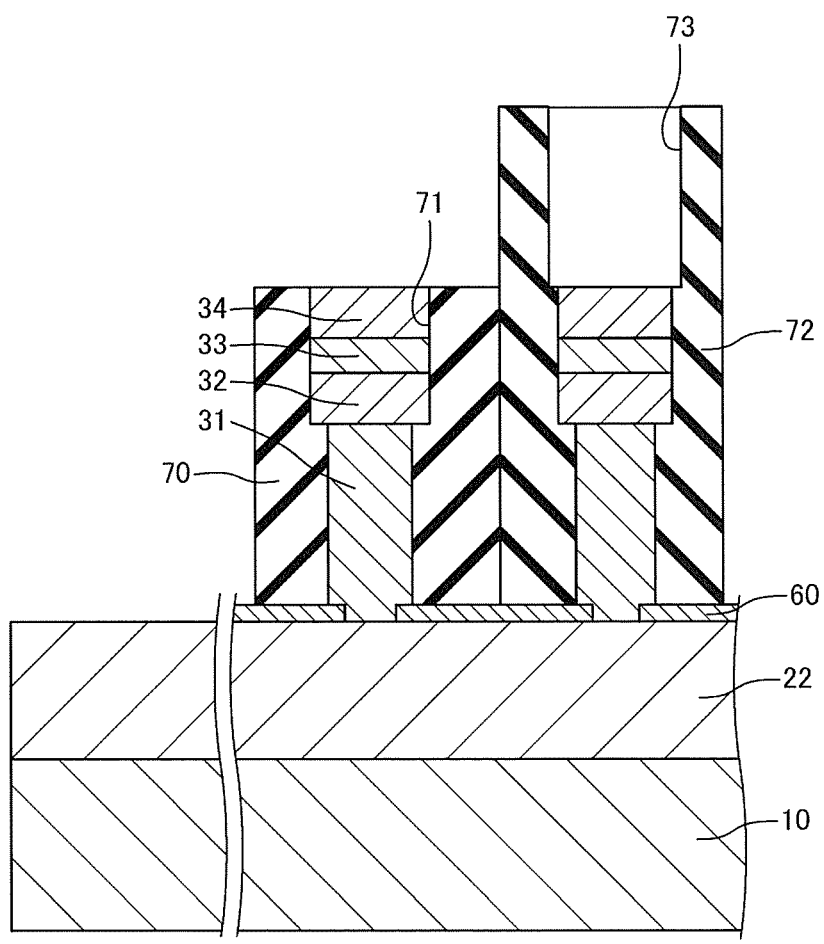
FIG. 9 is a cross-sectional view diagrammatically showing one of the steps of manufacturing the light emitting apparatus according to the present embodiment.

The first semiconductor layer 31, the first guide layer 32, the light emitting layer 33, and the second guide layer 34 are epitaxially grown on the buffer layer 22 in each of the openings 71 and 73, as shown in FIG. 9. In the illustrated example, the first SAG layers 70 are flush with the second guide layers 34.

Figure 10:
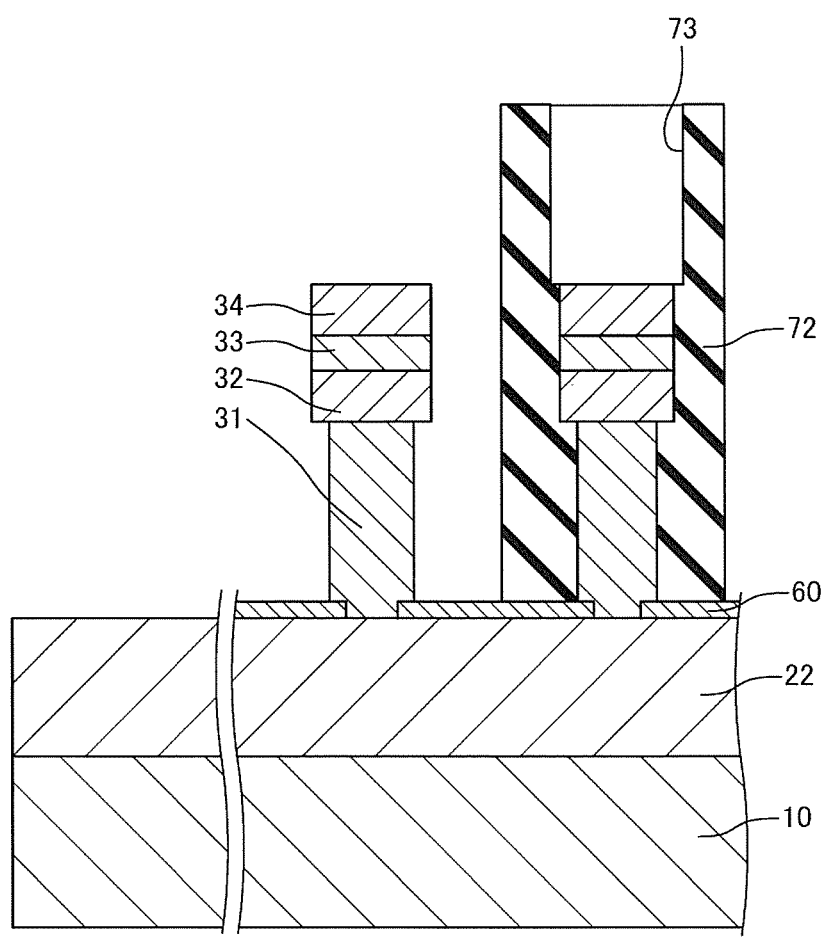
FIG. 10 is a cross-sectional view diagrammatically showing one of the steps of manufacturing the light emitting apparatus according to the present embodiment.

The first SAG layers 70 are removed, for example, by wet etching, as shown in FIG. 10. Coating layers that are not shown may be formed on the second guide layers 34 located in the openings 73 to prevent the second guide layers 34 located in the openings 73 from being etched by the wet etching. The coating layers are removed when the second semiconductor layers 35 are grown. Furthermore, the second SAG layers 72 may each be covered with a coating layer that is not shown so that the second SAG layers 72 are not removed by the wet etching. The material of the first SAG layers 70 may be different from the material of the second SAG layers 72 so that the second SAG layers 72 are not removed by the wet etching.

Figure 11:
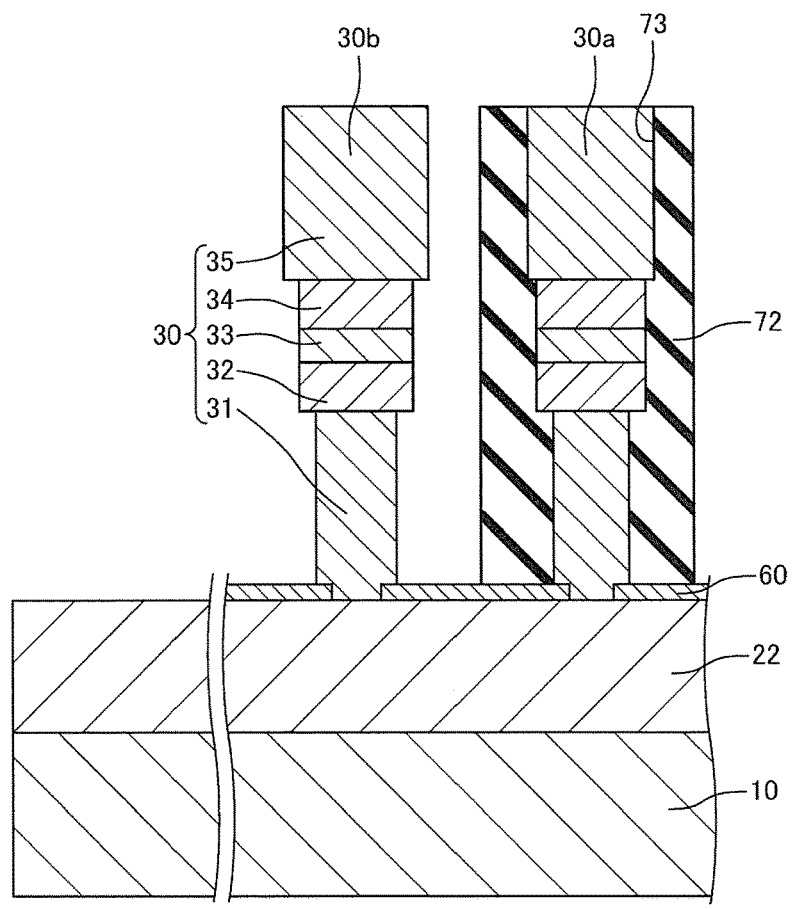
FIG. 11 is a cross-sectional view diagrammatically showing one of the steps of manufacturing the light emitting apparatus according to the present embodiment.

The second semiconductor layers 35 are epitaxially grown on the second guide layers 34 as shown in FIG. 11. The second semiconductor layers 35 are epitaxially grown under conditions that the second guide layers 34 that have no crystal surface exposed due to the wet etching for removing the first SAG layers 70 (second guide layers 34 located in the openings 73) more readily capture the dopants than the second guide layers 34 that have crystal surfaces exposed due to the wet etching. The carrier concentration in the second semiconductor layer 35 in each of the first columnar sections 30a can thus be higher than the carrier concentration in the second semiconductor layer 35 in each of the second columnar sections 30b. In the illustrated example, the second SAG layers 72 are flush with the second semiconductor layers 35.

Thereafter, the second SAG layers 72 are removed, for example, by wet etching, and the first electrode 50 and the second electrode 52 are formed.

The light emitting apparatus 100 can be manufactured by carrying out the steps described above.

4. Projector

Figure 12:
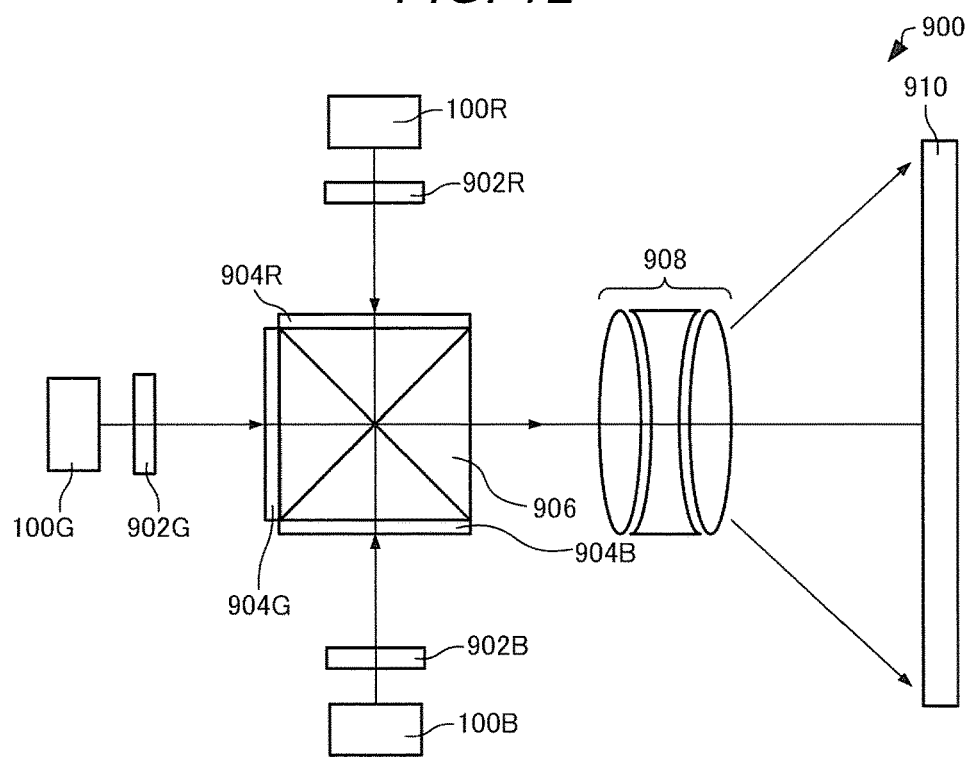
FIG. 12 diagrammatically shows a projector according to the present embodiment.

A projector according to the present embodiment will next be described with reference to the drawings. FIG. 12 diagrammatically shows a projector 900 according to the present embodiment.

The projector 900 includes, for example, the light emitting apparatus 100 as a light source.

The projector 900 includes an enclosure that is not shown and a red light source 100R, a green light source 100G, and a blue light source 100B, which are provided in the enclosure and emit red light, green light, and blue light, respectively. In FIG. 12, the red light source 100R, the green light source 100G, and the blue light source 100B are simplified for convenience.

The projector 900 further includes a first optical element 902R, a second optical element 902G, a third optical element 902B, a first light modulator 904R, a second light modulator 904G, a third light modulator 904B, and a projection apparatus 908, which are provided in the enclosure. The first light modulator 904R, the second light modulator 904G, and the third light modulator 904B are each, for example, a transmissive liquid crystal light valve. The projection apparatus 908 is, for example, a projection lens.

The light outputted from the red light source 100R enters the first optical element 902R. The light outputted from the red light source 100R is collected by the first optical element 902R. The first optical element 902R may have another function in addition to the light collection function. The same holds true for the second optical element 902G and the third optical element 902B, which will be described later.

The light collected by the first optical element 902R enters the first light modulator 904R. The first light modulator 904R modulates the light having entered it in accordance with image information. The projection apparatus 908 then enlarges an image formed by the first light modulator 904R and projects the enlarged image on a screen 910.

The light outputted from the green light source 100G enters the second optical element 902G. The light outputted from the green light source 100G is collected by the second optical element 902G.

The light collected by the second optical element 902G enters the second light modulator 904G. The second light modulator 904G modulates the light having entered it in accordance with image information. The projection apparatus 908 then enlarges an image formed by the second light modulator 904G and projects the enlarged image on the screen 910.

The light outputted from the blue light source 100B enters the third optical element 902B. The light outputted from the blue light source 100B is collected by the third optical element 902B.

The light collected by the third optical element 902B enters the third light modulator 904B. The third light modulator 904B modulates the light having entered it in accordance with image information. The projection apparatus 908 then enlarges an image formed by the third light modulator 904B and projects the enlarged image on the screen 910.

The projector 900 can further include a cross dichroic prism 906, which combines the light fluxes outputted from the first light modulator 904R, the second light modulator 904G, and the third light modulator 904B with one another and guides the combined light to the projection apparatus 908.

The three color light fluxes modulated by the first light modulator 904R, the second light modulator 904G, and the third light modulator 904B enter the cross dichroic prism 906. The cross dichroic prism 906 is formed by bonding four right-angled prisms to each other, and a dielectric multilayer film that reflects the red light and a dielectric multilayer film that reflects the blue light are disposed at the inner surfaces of the combined prisms. The dielectric multilayer films combine the three color light fluxes with one another to form light representing a color image. The combined light is then projected by the projection apparatus 908 on the screen 910. An enlarged image is thus displayed.

The red light source 100R, the green light source 100G, and the blue light source 100B may instead directly form images without using of the first light modulator 904R, the second light modulator 904G, or the third light modulator 904B but controlling the respective light emitting apparatuses 100 as the pixels of the images in accordance with image information. The projection apparatus 908 may then enlarge and project the images formed by the red light source 100R, the green light source 100G, and the blue light source 100B on the screen 910.

In the example described above, transmissive liquid crystal valves are used as the light modulators, and light valves not based on liquid crystal materials or reflective light valves may be used. Examples of such light valves may include reflective liquid crystal light valves and digital micromirror devices. The configuration of the projection apparatus is changed as appropriate in accordance with the type of the light valves used in the projector.

The present disclosure is also applicable to a light emitting apparatus of a scanning-type image display apparatus including a light source and a scanner that is an image formation apparatus that displays an image having a desired size on a display surface by scanning the screen with the light from the light source.

The light emitting apparatus according to the embodiment described above can be used in other applications in addition to a projector. Examples of the applications other than a projector may include an indoor or outdoor illuminator, a backlight of a display, a laser printer, a scanner, an in-vehicle light, a sensing instrument using light, and a light source of a communication instrument.

The present disclosure encompasses substantially the same configuration as the configuration described in the embodiment, for example, a configuration having the same function, using the same method, and providing the same result or a configuration having the same purpose and providing the same effect. Furthermore, the present disclosure encompasses a configuration in which an inessential portion of the configuration described in the embodiment is replaced. Moreover, the present disclosure encompasses a configuration that provides the same effects and advantages as those provided by the configuration described in the embodiment or a configuration that can achieve the same purpose as that achieved by the configuration described in the embodiment. Furthermore, the present disclosure encompasses a configuration in which a known technology is added to the configuration described in the embodiment.

The following contents are derived from the embodiment and variations described above.

A light emitting apparatus according to an aspect of the present disclosure includes a laminated structure including a plurality of columnar section assemblies each formed of p columnar sections. The p columnar sections each include a light emitting layer. When viewed in the lamination direction of the laminated structure, the ratio of the maximum width to the minimum width of the light emitting layer in each of q first columnar sections out of the p columnar sections is greater than the ratio of the light emitting layer in each of r second columnar sections out of the p columnar sections. The light emitting layer in each of the p columnar sections does not have a rotationally symmetrical shape. The parameter p is an integer greater than or equal to 2. The parameter q is an integer greater than or equal to 1 but smaller than p. The parameter r is an integer that satisfies r=p−q.

According to the light emitting apparatus described above, the light emitted from the light emitting apparatus is linearly polarized. The light emitting apparatus is therefore preferably used, for example, as the light source of a projector using a liquid crystal light valve.

In the light emitting apparatus according to the aspect, when viewed in the lamination direction, the area of the light emitting layer in each of the first columnar sections may be equal to the area of the light emitting layer in each of the second columnar sections.

According to the light emitting apparatus, the light emission characteristics of the light emitting layer in each of the first columnar sections can be made closer to the light emission characteristics of the light emitting layer in each of the second columnar sections.

In the light emitting apparatus according to the aspect, the p columnar sections may each include an n-type first semiconductor layer and a p-type second semiconductor layer. The light emitting layer may be provided between the first semiconductor layer and the second semiconductor layer. When viewed in the lamination direction, the difference in the ratio between the second semiconductor layer in each of the first columnar sections and the second semiconductor layer in each of the second columnar sections may be smaller than the difference in the ratio between the light emitting layer in each of the first columnar sections and the light emitting layer in each of the second columnar sections.

According to the light emitting apparatus described above, the difference in the I-V characteristics between the first columnar sections and the second columnar sections can be reduced.

In the light emitting apparatus according to the aspect, the carrier concentration in the second semiconductor layer in each of the first columnar sections may be higher than the carrier concentration in the second semiconductor layer in each of the second columnar sections.

According to the light emitting apparatus described above, for example, the resistance of the second semiconductor layer in each of the first columnar sections can be made closer to the resistance of the second semiconductor layer in each of the second columnar sections.

A projector according to another aspect of the present disclosure includes the light emitting apparatus according to the aspect of the present disclosure.

What is claimed is:

1. A light emitting apparatus comprising:
   a laminated structure including a plurality of columnar section assemblies each formed of p columnar sections,
   wherein the p columnar sections each include a light emitting layer,
   when viewed in a lamination direction of the laminated structure, a ratio of a maximum width to a minimum width of the light emitting layer in each of q first columnar sections out of the p columnar sections is greater than the ratio of the light emitting layer in each of r second columnar sections out of the p columnar sections, the light emitting layer in each of the p columnar sections does not have a rotationally symmetrical shape, the parameter p is an integer greater than or equal to 2, the parameter q is an integer greater than or equal to 1 but smaller than p, and the parameter r is an integer that satisfies r=p−q, wherein the p columnar sections each include an n-type first semiconductor layer and a p-type second semiconductor layer, the light emitting layer is provided between the first semiconductor layer and the second semiconductor layer, and a carrier concentration in the second semiconductor layer in each of the q first columnar sections is higher than a carrier concentration in the second semiconductor layer in each of the r second columnar sections.

2. The light emitting apparatus according to claim 1, wherein when viewed in the lamination direction, an area of the light emitting layer in each of the q first columnar sections is equal to an area of the light emitting layer in each of the r second columnar sections.

3. The light emitting apparatus according to claim 1, wherein when viewed in the lamination direction, a difference in the ratio between the second semiconductor layer in each of the q first columnar sections and the second semiconductor layer in each of the r second columnar sections is smaller than a difference in the ratio between the light emitting layer in each of the q first columnar sections and the light emitting layer in each of the r second columnar sections.

4. A projector comprising the light emitting apparatus according to claim 1.

* * * * *